United States Patent [19]

Murakami

[11] Patent Number: 5,154,277
[45] Date of Patent: Oct. 13, 1992

[54] ELECTRONIC PARTS SEPARATION MECHANISM

[75] Inventor: Itsuro Murakami, Tokyo, Japan

[73] Assignee: Hakuto Co., Ltd., Tokyo, Japan

[21] Appl. No.: 824,171

[22] Filed: Jan. 22, 1992

[30] Foreign Application Priority Data

Jan. 22, 1991 [JP] Japan ................. 3-1482[U]

[51] Int. Cl.⁵ ............................... B65G 47/06
[52] U.S. Cl. ................. 198/463.6; 198/463.6
[58] Field of Search ......................... 198/463.6

[56] References Cited

U.S. PATENT DOCUMENTS

| | | | |
|---|---|---|---|
| 4,354,591 | 10/1982 | Sexstone et al. | 198/463.6 |
| 4,733,459 | 3/1988 | Tateno | 198/463.6 |
| 5,097,936 | 3/1992 | Dorner et al. | 198/463.6 |

FOREIGN PATENT DOCUMENTS

| | | | |
|---|---|---|---|
| 156919 | 9/1982 | Japan | 198/463.6 |
| 169414 | 7/1986 | Japan | 198/463.6 |
| 12519 | 1/1987 | Japan | 198/463.6 |
| 17321 | 8/1987 | Japan | 198/463.6 |

*Primary Examiner*—Joseph E. Valenza
*Attorney, Agent, or Firm*—Wenderoth, Lind & Ponack

[57] ABSTRACT

A mechanism for receiving electronic parts transported by a conveyor belt and dispensing them one at a time, comprises a stop pawl member and a lift pawl member which are disposed forwardly and rearwardly, respectively, along the belt. Each of the pawl members is bifurcated. Both the pawl members can be located either below the belt at their lower positions or above the belt at therir upper positions. A drive device actuates these pawl members to alternately and oppositely take their respective upper positions and lower positions. These pawl members at their lower positions permit the electronic part on the conveyor belt to pass. The stop pawl member at its upper position engages a front face of the electronic part to stop its advance. The lift pawl member at its upper position lifts the electronic part from the belt to urge it against a plate member.

1 Claim, 3 Drawing Sheets

ELECTRONIC PARTS SEPARATION MECHANISM

BACKGROUND OF THE INVENTION

1. FIELD OF THE INVENTION

This invention relates to a mechanism for receiving electronic parts, e.g., IC chips, continuously transported by a conveyor belt and separating or dispensing them one at a time. The electronic parts separation mechanism in accordance with the present invention is particularly suitable to be used in a conveyor portion which is a downstream-most part of an apparatus for delivering electronic parts to a device for mounting them onto a substrate.

2. Description of the Prior Art

The above-mentioned electronic parts delivering apparatus conventionally includes a frame body, a stick holder which is attached to the frame body and which releasably holds a stick having an open outlet end and accommodating a plurality of electronic parts therein, a chute arranged in an inlined manner so as to slidably guide the electronic parts taken out from the open outlet end of the stick by a gravitational force, and a conveyor portion for receiving the electronic parts at the end of the chute and transporting them by a conveyor belt to a pick-up point. The electronic parts, which have been transported to the pick-up point on the conveyor belt, are picked-up there and are supplied to a device for mounting such electronic parts onto a substrate.

The electronic parts are dispensed by means of a separation mechanism to the pick-up point one at a time. The separation mechanism is known in the art in which a pair of pawl members are positioned above the electronic parts riding on the conveyor belt. The pawl members are arranged to alternately extend downwardly. Forward and rearward pawl members extend, respectively, in front of and behind a particular electronic part which is the one closest to the pick-up point on the conveyor, i.e., the first one of a series of the electronic parts. While the forward pawl member extends downwardly to engage the front surface of the first electronic part to thereby interfere with forward movement thereof, the rearward pawl member is positioned at its upper retracted position. Then, the rearward pawl extends between the first electronic part and a succeeding or second electronic part and, almost simultaneously, the forward pawl member is retracted to its upper position. Thus, the first electronic part is dispensed to the pick-up point by the moving conveyor belt, while the succeeding or second electronic part is prevented by the rearward pawl member from moving forward. At substantially the same time when the forward pawl member again extends downwardly from its upper or retracted position, the rearward pawl member retracts to its upper position to allow the succeeding or second electronic part to be advanced by the moving conveyor belt until the second electronic part comes in contact with the forward pawl member. Thus the second electronic part becomes the forward-most or new first electronic part. The above operations are repeated and the electronic parts are dispensed to the pick-up point one at a time.

It should be noted that electronic parts usually vary in length according to the number of pins involved therein and to manufacturing tolerance. Therefore, the prior art separation mechanism as mentioned above tends to cause jamming due to inadvertent engagement of the pawl members with the upper surfaces of the electronic parts. It may, therefore, be required to modify the operation or design of the separation mechanism when it is used for electronic parts of different length. However, this is very disadvantageous in view of manufacturing costs.

In order to eliminate the above problems, a separation mechanism has been proposed in which a rearward pawl member is designed to, when actuated, come into contact with the upper surface of the electronic part so as to urge it downwardly against the belt conveyor to thereby stop the electronic part.

This mechanism, however, has disadvantages in that the stability of actuation of the conveyor belt is influenced since the belt is subject to a pressing force tending to hold it upon actuation of the rearward pawl member. This force causes a decrease in speed of the belt and, in some extreme cases, stoppage of the belt.

SUMMARY OF THE INVENTION

It is a main object of the invention to provide a separation mechanism for electronic parts which is able to reliably dispense electronic parts having varying lengths one at a time, while having no bad influence on the actuation of the conveyor belt.

In order to achieve the above object, the present invention provides a mechanism for receiving electronic parts continuously transported by a conveyor belt and separating or dispensing the electronic parts one at a time, comprising first and second pawl members disposed along the belt forwardly and rearwardly, respectively, with respect to the direction of movement of the belt and being longitudinally spaced from each other a distance slightly larger than the lengths of individual electronic parts, and a drive means for actuating the first and second pawl members; wherein each of the first and second pawl members includes a pair of pawls laterally spaced from each other a distance slightly larger than the width of the conveyor belt; wherein the first and second pawl members are adapted to alternately and oppositely take their respective lower positions and upper positions upon actuation of the drive means, the first and second pawl members at their lower positions being located below an upper surface of the conveyor belt so as to permit the electronic part on the belt to pass, the first pawl member at its upper position protruding upwardly beyond the upper surface of the belt so as to engage a front face of the electronic part to thereby stop further advancement thereof, and the second pawl member at its upper position protruding upwardly beyond the upper surface of the belt so as to engage side marginal portions of a bottom surface of the electronic part extending laterally beyond side edges of the belt to thereby lift the electronic part from the upper surface of the belt; and wherein a plate member is provided at a position above the second pawl member, whereby, when the electronic part is lifted by the second pawl member, an upper surface of the electronic part is urged against the plate member.

OPERATION

In the separation mechanism of the present invention, the first pawl member, when actuated, moves upwardly from its lower position below the belt to its upper position so as to engage the front face of the first electronic part to thereby prevent further movement thereof. At this time, the second pawl member which is disposed rearwardly of the first pawl member takes its lower or retracted position below the belt. Then, the second pawl member moves upwardly from its lower position to its upper position so as to engage the side marginal portions of the bottom surface of the succeeding or second electronic part to thereby lift the second electronic part from the upper surface of the belt. At substantially the same time, the first pawl member comes to take its lower or retracted position. During the first electronic part is dispensed to the pick-up point by means of the movement of the belt, the succeeding or second electronic part is kept being lifted-up by the second pawl member an is prevented from moving forwardly. At substantially the same time when the first pawl member moves upwardly to its upper position, the second pawl member moves downwardly and lowers the succeeding or second electronic part onto the belt. The second electronic part put down on the belt is forwarded by the belt until it engages the first pawl member, thus becoming a new first electronic part. By repeating the above operations, the electronic parts are dispensed to the pick-up point one at a time.

The plate member which is provided above the second pawl member securely holds the electronic part which is lifted upwardly by the second pawl member and urged against the plate member.

The separation mechanism according to the present invention permits electronic parts to be securely dispensed one at a time, even when the electronic parts have variance in length, since the mechanism is designed to lift the electronic part from the belt and urge the electronic part against the plate member disposed above the belt when it is intended to stop the electronic part. Furthermore, since the mechanism applies no force to the belt, operation or actuation of the belt cannot be disturbed.

DESCRIPTION OF THE PREFERRED EMBODIMENT

Figure 4:
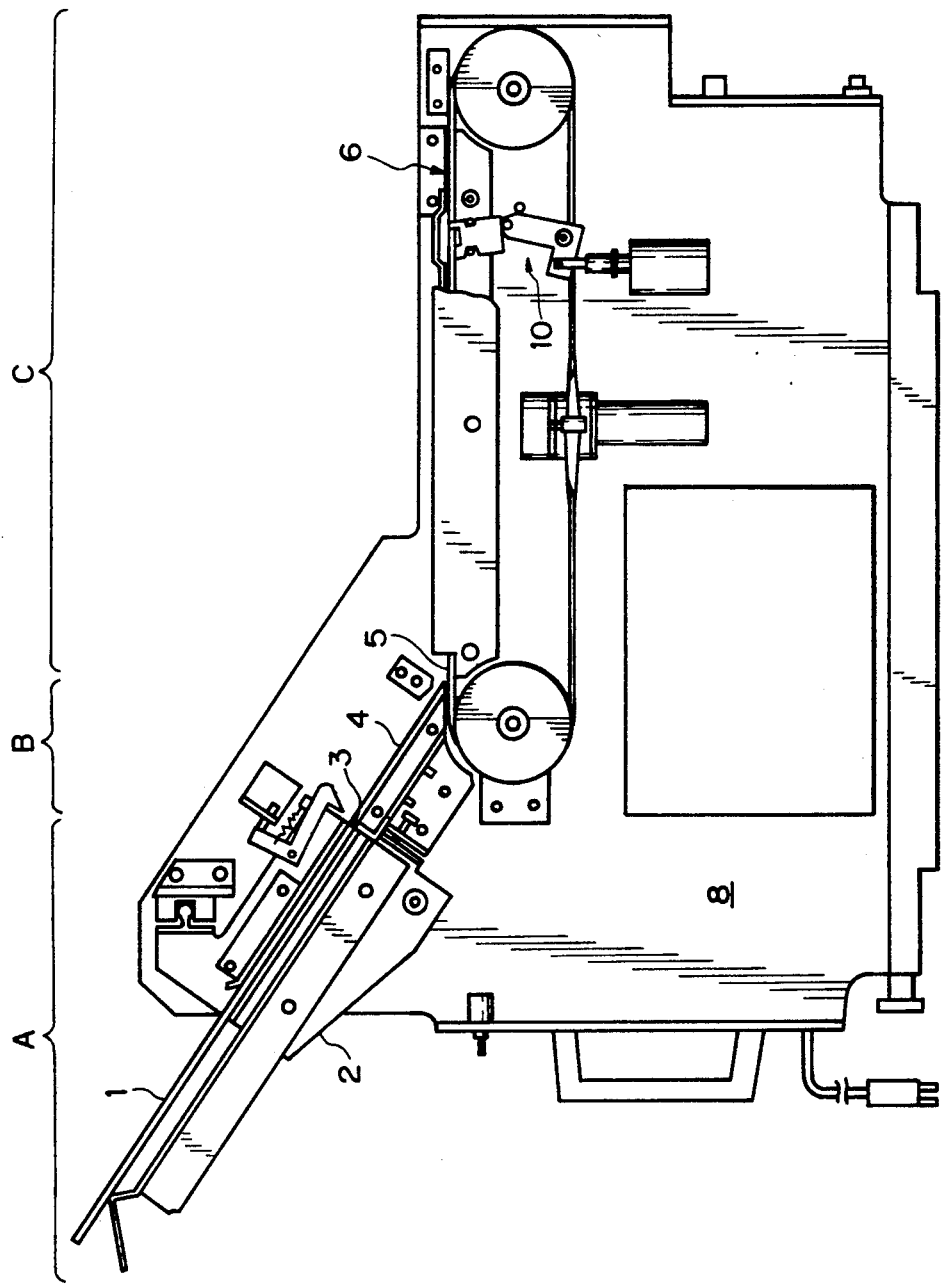
FIG. 4 is a side elevational view of an apparatus for delivering electronic parts to which the mechanism according to the invention will be suitably applied.

An electronic parts delivery apparatus, to which the mechanism according to the invention will be suitably applied, is located in conjunction with a device for mounting electronic parts, e.g., IC chips, supplied from the delivery apparatus onto a substrate. The delivery apparatus can be divided, in view of its function, into a stick holder portion (A), a chute portion (B) and a conveyor portion (C), as shown in FIG. 4. In the stick holder portion (A), a stick 1 accommodating a plurality of electronic parts is releasably held by a stick holder 2. In the chute portion (B), a chute 4 receives electronic parts, which have been taken out from the stick 1, to guide them downwardly by means of a gravitational force. In the conveyor portion (C), a conveyor belt 5 receives the electronic parts from the chute 4 and transports them to a point near the end of the path of the conveyor belt. At this point, the electronic parts are dispensed by a separation mechanism 10 one at a time to a pick-up point 6. The electronic part at the pick-up point 6 is picked up and is supplied to a mounting device (not shown).

Figure 1:
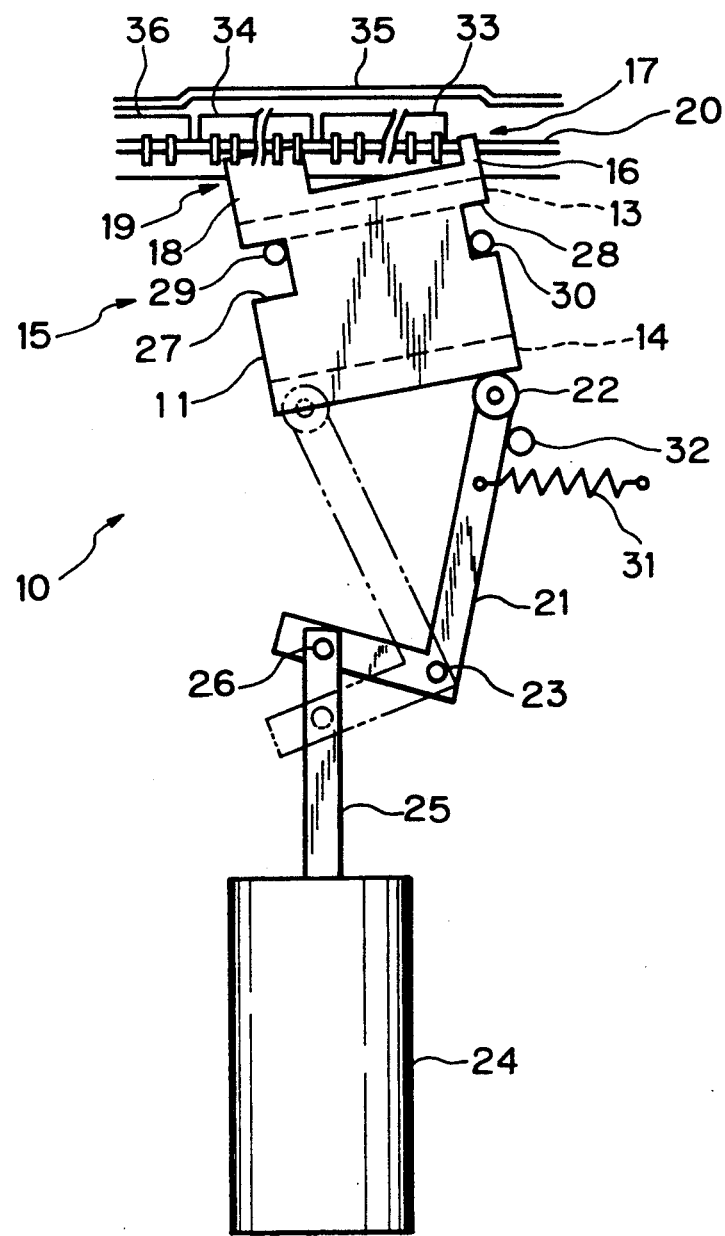
FIG. 1 is a side elevational view of a mechanism for separating electronic parts according to one embodiment of the invention, showing one operation mode thereof.
Figure 2:
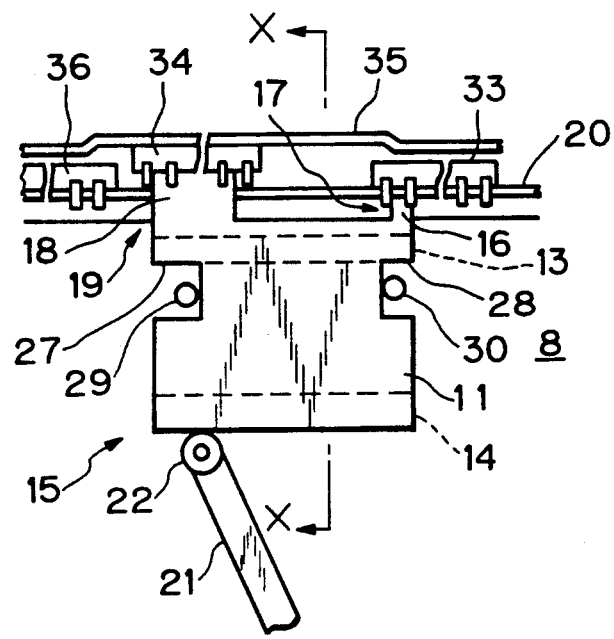
FIG. 2 is similar to FIG. 1, showing the other operation mode.
Figure 3:
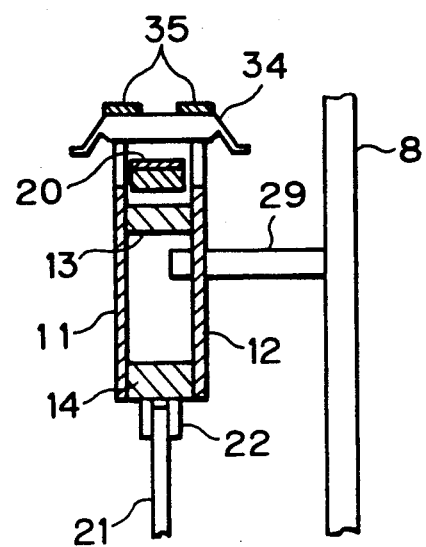
FIG. 3 is a cross-sectional view taken along line X—X of FIG. 2.

Referring to FIGS. 1, 2 and 3, the separation mechanism 10 according to one embodiment of the invention includes an escape 15 consisting of a pair of plates 11, 12 and upper and lower spacers 13, 14 connecting between the plates 11 and 12. The escape 15 includes at the upper portion thereof a stop pawl member 17 consisting of a pair of pawls 16 (only one is shown in FIGS. 1 and 2), and a lift pawl member 19 consisting of a pair of pawls 18 (only one is shown in FIGS. 1 and 2, but both are shown in FIG. 3). The stop pawl member 17 and the lift pawl member 19 are disposed along a conveyor belt 20 forwardly and rearwardly, respectively, with respect to the direction of movement of the belt 20 (rightward seen in FIGS. 1 and 2) of a travel of a conveyor belt 20. The stop pawl member 17 and the lift pawl member 19 are spaced from each other a distance slightly larger than the lengths of individual electronic parts. The pair of pawls 16 forming the stop pawl member 17, as well as the pair of pawls 18 forming the lift pawl member 19, are laterally spaced from each other a distance slightly larger than the width of the belt 20.

A link lever 21 has at its upper end a roller 22 which is in contact with a lower surface of the lower spacer 14 of the escape 15. An intermediate bent portion of the link lever 21 is pivotally connected to a pin 23 which is secured to a stationary frame member 8. A lower end of the link lever 21 is pivotally connected to an upper end of a rod 25 of a solenoid 24 by means of a pin 26. The pair of plates 11 and 12 constituting the escape 15 are formed with grooves 27, 28 on either side of the escape 15. Stop pins 29, 30 protrude from the stationary frame 8 so as to be engageable with the respective grooves 27, 28.

Now, operation of the mechanism 10 having the above structure will be explained. In FIG. 1, the solenoid 24 working as a drive means is in a de-energized condition and the link lever 21 is urged by a tension spring 31 to pivot and take a position shown by a solid line. A pin 32 secured to the stationary frame member 8 engages the link lever 21 so as to prevent the link lever 21 from excessively pivoting in the clockwise direction. At this stage, the roller 22 is positioned at a rightward position on the spacer 14 and, hence, the escape 15 takes a leftwardly inclined posture due to the interengagement between the grooves 27, 28 and the stop pins 29, 30. The stop pawl member 17 in FIG. 1 takes its upper position and the pair of pawls 16 protrude upwardly from both sides of the belt 20 so as to engage the front face of the first electronic part 33 to thereby prevent rightward movement of the first electronic part 33. On the other hand, the lift pawl member 19 takes a lower or retracted position in which it is located below the upper surface of the belt 20.

When the solenoid 24 is actuated or energized and thus the rod 25 is retracted, the link lever 21 pivots about the pin 23 in the counter-clockwise direction to take a position as shown by the two-dot chain line in FIG. 1. At this stage, the roller 22 is positioned at a leftward position on the spacer 14, so that the escape 15 takes a substantially horizontal posture (as shown in FIG. 2) due to the interengagement between the grooves 27, 28 and the stop pins 29, 30. The stop pawl member 17 in FIG. 2 takes its lower or retracted position below the upper surface of the belt 20 so as to permit advancement of the first electronic part 33. On the other hand, the lift pawl member 19 takes its upper position in which the pair of pawls 18 protrude upwardly from both sides of the belt 20 so as to engage side marginal portions of a bottom surface of a second electronic part 34 to thereby lift the second electronic part 34 from the belt 20.

A plate member 35 is attached to the stationary frame member 8 and is located at a position above the lift pawl member 19 so that the upper surface of the electronic part 34 lifted by the lift pawl member 19 is urged against the plate member 35. The pair of pawls 18 constituting the lift pawl member 19 have a enough length along the direction of movement of the belt 20 to effectively perform the above lift-up operation. Even if the individual electronic parts are located at slightly different positions on the belt 20 due to their variance in length, the lift pawl member 19 can lift-up the electronic parts without failure.

Thus, the second or succeeding electronic part 34 can be stopped without applying any force to the belt. A third electronic part 36 can be prevented from moving forwardly due to the contact thereof with the second electronic part 34.

The solenoid 24 is turned to de-energized condition after the first electronic part 33 had been dispensed to the pick-up point 6 and then has been supplied to the mounting device. Thus, the escape 15 take a posture as shown in FIG. 1. Then, the second electronic part 34, having been lifted-up by the lift pawl member 19, is lowered onto the upper surface of the belt 20 so as to be transported forwardly by the belt 20. When the front face of the second electronic part 34 comes to contact the stop pawl member 17, the forward movement of the second electronic part 34 is stopped and the second electronic part 34 becomes a new first electronic part.

Due to the repetition of the above operations, the electronic parts can be dispensed to the pick-up point 6 one at a time.

What is claimed is:

1. A mechanism for receiving electronic parts continuously transported by a conveyor belt and separating or dispensing said electronic parts one at a time, comprising first and second pawl members disposed along said belt forwardly and rearwardly, respectively, with respect to the direction of movement of said belt and being longitudinally spaced from each other a distance slightly larger than the lengths of individual electronic parts, and a drive means for actuating said first and second pawl members; wherein each of said first and second pawl members includes a pair of pawls laterally spaced from each other a distance slightly larger than the width of said conveyor belt; wherein said first and second pawl members are adapted to alternately and oppositely take their respective lower positions and upper positions upon actuation of said drive means, said first and second pawl members at their lower positions being located below an upper surface of said conveyor belt so as to permit the electronic part on the belt to pass, said first pawl member at its upper position protruding upwardly beyond the upper surface of said belt so as to engage a front face of the electronic part to thereby stop further advancement thereof, and said second pawl member at its upper position protruding upwardly beyond the upper surface of said belt so as to engage side marginal portions of a bottom surface of the electronic part extending laterally beyond side edges of the belt to thereby lift the electronic part from the upper surface of the belt; and wherein a plate member is provided at a position above said second pawl member, whereby, when the electronic part is lifted by said second pawl member, an upper surface of said electronic part is urged against said plate member.

* * * * *